United States Patent
Suehiro

(10) Patent No.: US 7,411,295 B2
(45) Date of Patent: Aug. 12, 2008

(54) CIRCUIT BOARD, DEVICE MOUNTING STRUCTURE, DEVICE MOUNTING METHOD, AND ELECTRONIC APPARATUS

(75) Inventor: Mitsuo Suehiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 10/948,231

(22) Filed: Sep. 24, 2004

(65) Prior Publication Data

US 2005/0224971 A1 Oct. 13, 2005

(30) Foreign Application Priority Data

Apr. 2, 2004 (JP) ............................ 2004-110583

(51) Int. Cl.
*H01L 23/52* (2006.01)
*H01L 23/12* (2006.01)
*H01L 21/44* (2006.01)

(52) U.S. Cl. .............................. 257/737; 257/E23.004; 257/E23.173; 257/E23.177; 257/E27.112; 257/786; 257/668; 257/700; 257/701; 257/758; 257/203; 257/208; 257/211; 257/E23.079; 438/613; 438/666

(58) Field of Classification Search ................. 257/737, 257/E23.079, E23.004, E23.173, E23.177, 257/E27.112, 786, 738, 668, 700, 701, 758, 257/203, 211, 208, 774
See application file for complete search history.

(56) References Cited

U.S. PATENT DOCUMENTS

| 3,942,245 | A | * | 3/1976 | Jackson et al. ................ 29/827 |
| 5,796,165 | A | * | 8/1998 | Yoshikawa et al. .......... 257/728 |
| 5,808,474 | A | * | 9/1998 | Hively et al. ................ 324/755 |
| 5,998,875 | A | * | 12/1999 | Bodo et al. ................. 257/778 |
| 6,093,331 | A | * | 7/2000 | Wollesen ....................... 216/2 |
| 6,799,976 | B1 | * | 10/2004 | Mok et al. ................... 439/55 |
| 6,872,893 | B2 | * | 3/2005 | Fukuoka et al. ............. 174/255 |
| 7,068,059 | B2 | * | 6/2006 | Hanke et al. ................ 324/765 |
| 2001/0038145 | A1 | * | 11/2001 | Mashino ..................... 257/707 |
| 2001/0039724 | A1 | * | 11/2001 | Ohshima et al. ............. 29/832 |
| 2001/0050428 | A1 | * | 12/2001 | Ando et al. ................. 257/700 |
| 2002/0027022 | A1 | * | 3/2002 | Moriizumi ................... 174/267 |
| 2002/0109514 | A1 | * | 8/2002 | Brandorff et al. ........... 324/754 |
| 2002/0179329 | A1 | * | 12/2002 | Fukuoka et al. ............. 174/260 |
| 2002/0185303 | A1 | * | 12/2002 | Takeuchi et al. ............ 174/256 |
| 2003/0056980 | A1 | * | 3/2003 | Takeuchi et al. ............ 174/255 |
| 2003/0063453 | A1 | * | 4/2003 | Kusagaya et al. ........... 361/794 |
| 2003/0132529 | A1 | * | 7/2003 | Yeo et al. .................... 257/778 |
| 2003/0157747 | A1 | * | 8/2003 | Chen et al. .................. 438/106 |
| 2003/0164551 | A1 | * | 9/2003 | Lee et al. .................... 257/778 |
| 2004/0016995 | A1 | * | 1/2004 | Kuo et al. .................... 257/678 |
| 2004/0053444 | A1 | * | 3/2004 | Yoneda et al. .............. 438/106 |

(Continued)

FOREIGN PATENT DOCUMENTS

JP 03-270030 A 12/1991

(Continued)

*Primary Examiner*—Alexander O Williams
(74) *Attorney, Agent, or Firm*—Westerman, Hattori, Daniels & Adrian, LLP.

(57) ABSTRACT

A circuit board has a metal pattern that is formed on a surface of the circuit board to be connected with bumps in two-dimensional arrangement for mounting an electronic device that has the bumps. A plurality of the bumps which has even electrical potentials is electrically connected by the metal pattern on the surface of the circuit pattern.

5 Claims, 6 Drawing Sheets

U.S. PATENT DOCUMENTS

| | | | |
|---|---|---|---|
| 2004/0163849 A1* | 8/2004 | Takeuchi et al. | 174/262 |
| 2004/0173890 A1* | 9/2004 | Moriizumi | 257/686 |
| 2004/0188827 A1* | 9/2004 | Akashi | 257/700 |
| 2005/0029648 A1* | 2/2005 | Suwa et al. | 257/690 |
| 2005/0085105 A1* | 4/2005 | Hanke et al. | 439/67 |
| 2005/0088833 A1* | 4/2005 | Kikuchi et al. | 361/763 |
| 2005/0098882 A1* | 5/2005 | Kusagaya et al. | 257/734 |
| 2005/0106907 A1* | 5/2005 | Yamada et al. | 439/91 |
| 2005/0211561 A1* | 9/2005 | En | 205/125 |
| 2006/0061974 A1* | 3/2006 | Soga et al. | 361/743 |
| 2006/0072871 A1* | 4/2006 | Uchida | 385/14 |
| 2006/0076620 A1* | 4/2006 | Akamine et al. | 257/341 |
| 2006/0125078 A1* | 6/2006 | Shimizu et al. | 257/691 |
| 2006/0240595 A1* | 10/2006 | Lee et al. | 438/108 |

FOREIGN PATENT DOCUMENTS

| | | |
|---|---|---|
| JP | 07-235566 A | 9/1995 |
| JP | 08-288626 A | 11/1996 |
| JP | 9-181208 | 7/1997 |
| JP | 11-214442 | 8/1999 |
| JP | 11-274238 | 10/1999 |
| JP | 11-297872 A | 10/1999 |
| JP | 2001-177226 | 6/2001 |
| JP | 2001-284486 A | 10/2001 |
| JP | 2003-258149 A | 9/2003 |

\* cited by examiner

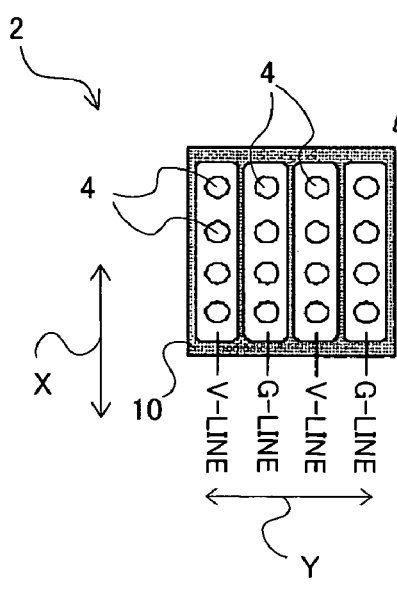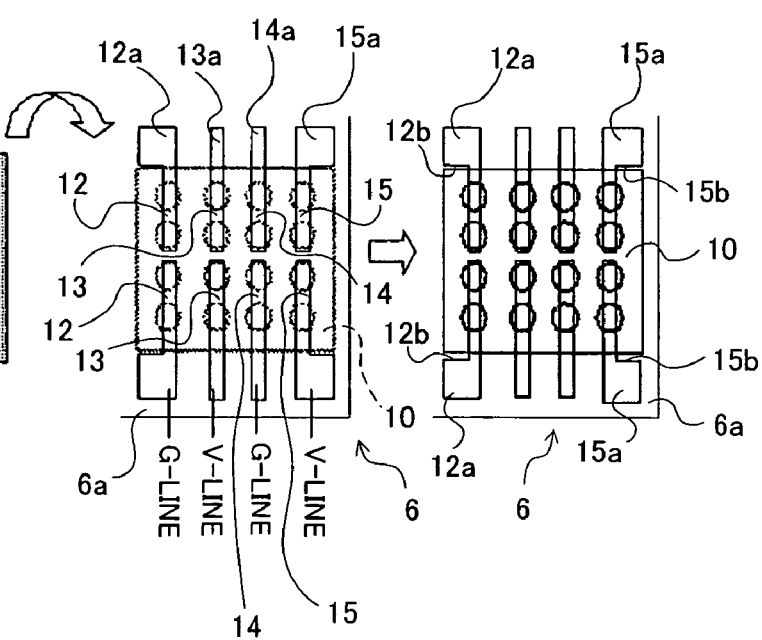
FIG. 1A  FIG. 1B  FIG. 1C

CIRCUIT BOARD, DEVICE MOUNTING STRUCTURE, DEVICE MOUNTING METHOD, AND ELECTRONIC APPARATUS

This application claims the right of priority under 35 U.S.C. § 119 based on Japanese Patent Application No. 2004-110583 filed on Apr. 2, 2004, which is hereby incorporated by reference herein in its entirety as if fully set forth herein.

BACKGROUND OF THE INVENTION

The present invention relates generally to a circuit board, a mounting structure, a mounting method, and an electronic apparatus, and more particularly to a circuit board that mounts an electronic device (for example, a condenser) that has bumps arranged two-dimensionally on its front surface or both of front and back surfaces or its mounting structure. The present invention is suitable for a printed circuit board on which a various electronic devices are mounted, for example, a motherboard or a graphic board, and for an electronic apparatus (for example, a server or a mobile phone) that contains the printed circuit board.

For recent widespreading of the electronic apparatus, the demand for the apparatus of higher performance and the cheaper is now growing. As a structure for mounting the electronic device such as a condenser on the printed circuit board used in the electronic apparatus such as a personal computer, a server, a mobile phone, or a PDA (personal digital assistants), FIG. 5 shows a connection of bumps 4 that are arranged two-dimensionally on an electronic device 2 and pads 8 that are arranged two-dimensionally on a circuit board 6. The bumps 4 and the pads 8 are connecting terminals and are generally formed approximately hemispheric with using solder. The bumps 4 and the pads 8 are arranged in 4×4 square arrangement respectively and are arranged V-lines (high voltage terminal lines) and G-lines (ground terminal lines) alternately.

As shown in FIG. 5A, the electronic device 2 is conventionally mounted on the circuit board 6 by the process of contacting the bumps 4 to the corresponding pads 8, putting the electronic device 2 and the circuit board 6 into a reflow furnace to heat them and melt solder, and connecting the bumps 4 with the pads 8. And as shown in FIG. 5B, the electronic device 2 is observed from the side by eye and "short/open check" that is an inspection for checking a gap of the circuit board 6 and the package of the electronic device 2 is approximately 0.1 mm evenly has been done. References 1 to 4 disclose the structures or the methods for mounting the electronic device onto the circuit board.

Reference 1: Japanese Patent Application Publication No. 11-274238
Reference 2: Japanese Patent Application Publication No. 2001-177226
Reference 3: Japanese Patent Application Publication No. 11-214442
Reference 4: Japanese Patent Application Publication No. 9-181208

However, an inspector has to be skillful because the inspection of the gap of 0.1 mm by eye is not easy. Therefore, the quality of the short/open check depends on the quality of the inspector and it is difficult to maintain a quality of the inspection constantly. And the short/open check needs a lot of time for observing by eye from several directions. So, a short/open check that is simple, high quality, and automatic is demanded to be real.

The electronic device 2 as is used generally has bumps 4 arranged squarely like shown as a conventional example. It may cause the mis-mounting of the electronic device 2 in a direction of 90° as shown in FIG. 5C. The mis-mounting cannot be found in the short/open check which uses eyes. The mis-mounting of the electronic device 2 will be finally found in a operation test of the circuit board 6 done after a lot of electronic devices were mounted on the circuit board 6.

In removing the electronic device 2 from the circuit board 6, there is no choice except using a pinching means such as tweezers or pliers (a removing with destruction method) as shown in FIG. 6A nor melting solder by blowing hot air from outside of the electronic device 2 (a hot air method) as shown in FIG. 6B. However, in the removing with destruction method, the electronic device 2 is destroyed with excessive stress and cannot be reused. The residue such as a part of the electronic device 2's bump 4 is left on the circuit board 6 after removing the electronic device 2, and should be taken off to reuse the circuit board 6. In the hot air method, it is easy to melt solder of the bumps 4 arranged near around the package 10 of the electronic device 2, and is difficult to conduct the heat to the solder of the bumps 4 arranged near the center of the electronic device 2. When removing the electronic device 2 in this state, the electronic device 2 should be taken off by using the pinching means and might be destroyed. Heating the bumps 4 sufficiently so as to melt solder of the bumps 4 arranged near the center of the electronic device 2 causes problem because of too much heat stress of the circuit board 6 and the electronic device 2.

BRIEF SUMMARY OF THE INVENTION

Accordingly, it is an exemplary object to provide a circuit board, a mounting structure of an electronic device onto the circuit board, a mounting method of an electronic device onto the circuit board, and an electronic apparatus that uses the circuit board, which are novel and useful. Concretely, it is an exemplary object to provide a circuit board that can connect with the electronic device securely in mounting, can prevent the mis-mounting, can simplify the positioning of the electronic device so that it can be mounted on automatically or manually, can be inspected easily and securely after mounting, can let the electronic device removed from the board without destruction or heat stress. It is also another exemplary object to provide a mounting structure of the electronic device on that circuit board.

To achieve above-mentioned objects, a circuit board of one aspect according to the present invention has a metal pattern to be connected with bumps in two-dimensional arrangement for mounting an electronic device that has the bumps. The metal pattern is formed on a surface of the circuit board, and a plurality of the bumps which has even electrical potentials is electrically connected by the metal pattern on the surface of the circuit pattern.

Because the metal pattern is formed on the surface of the circuit board so as to connect a plurality of the bumps electrically, the electronic device can connect with the circuit board easily and securely in comparison to the case where the bumps of small areas are connected with the pads of small areas with one another.

The electronic device may be a condenser. The electronic device may be another device such as a semiconductor device that includes IC chips or a resistant device.

The circuit board may be a printed circuit board that can mount the electronic device both on its front surface and on its back surface. The width of the metal pattern of the circuit board can be narrower than the width of the pads of the conventional circuit pattern. Therefore, the application area of the adhesive can be larger in mounting the electronic device on the circuit board. Then, it can use the provisional adhesion that has been conventionally difficult to apply to the electronic device having arrayed bumps, and it becomes easy to mount the electronic devices both on the front and on the back surfaces. This circuit board may be various printed circuit boards such as motherboards.

The two-dimensional arrangement may be a square arrangement that arranges the bumps at even intervals and the square arrangement may be formed by arranging ground terminal lines and positive electric potential terminal lines alternately. It may make the fabrication of the electronic device easy. Another arrangement excepting the square arrangement or the electric potential arrangement of each bump may be selectable in accordance with the situation of the design or the fabrication.

The metal pattern is preferable to have a protrusion that is elongated over a package of the electronic device. If the protrusion has a positioning part for positioning the electronic device by contacting a package of the electronic device, mounting of the electronic device on the circuit board will be easy and secure. For example, the electronic device can be positioned without using a fine positioning apparatus and it can be mounted on the board manually besides automatically. It becomes also easy to prevent the mis-mounting of the electronic device if the positioning part is formed in accordance with the package shape of the electronic device that is correctly mounted.

If the protrusion has a checking part for checking the connection of the electronic device and the material pattern, a highly reliable inspection can be done with ease. For example, if the checking part is electrically connected to the metal pattern, the short/open check can be done easily by applying a test apparatus such as a circuit tester to the checking part. As the inspection is not eye observation of the gap, it does not cause dispersive result depending on the inspector. As explained later, according to the arrangement of the electronic device's bumps or the shape of the metal pattern, the mis-mounting of the electronic device can be found easily.

If the protrusion has a heating part for contacting a heating means to melt solders of all the bumps which connect the metal pattern, the electronic device can be removed from the circuit board without heat stress or destruction. Besides, the removed electronic device can be reused. As there is no residue on the circuit board after removing the electronic device, removing process of the residue from the circuit board is not necessary when reusing the circuit board.

A device mounting structure of another aspect according to the present invention is a structure for mounting an electronic device on a circuit board. The electronic device has bumps in two-dimensional arrangement. A metal pattern is formed on a surface of the circuit pattern and is connected with a plurality of the bumps which has even electric potentials. The plurality of the bumps is electrically connected by the metal pattern on the surface of the circuit pattern.

Because the metal pattern is formed on the surface of the circuit board so as to connect a plurality of the bumps electrically, the electronic device can connect with the circuit board easily and securely in comparison to the case where the bumps of small areas are connected with the pads of small areas with one another.

The electronic device may be a condenser. The electronic device may be another device such as a semiconductor device that includes IC chips or a resistant device.

The circuit board may be a printed circuit board that can mount the electronic device both on its front surface and on its back surface. The width of metal pattern of the circuit board can be narrower than the width of the pads of the conventional circuit pattern. Therefore, the application area of the adhesive can be larger in mounting the electronic device on the circuit board. Then, it can use the provisional adhesion that has been conventionally difficult to apply to the electronic device having arrayed bumps, and it becomes easy to mount the electronic devices both on the front and on the back surfaces.

The two-dimensional arrangement may be a square arrangement that arranges the bumps at even intervals and the square arrangement may be formed by arranging ground terminal lines and positive electric potential terminal lines alternately. It may make the fabrication of the electronic device easy. Another arrangement excepting the square arrangement or the electric potential arrangement of each bump may be selectable in accordance with the situation of the design or the fabrication.

The metal pattern is preferable to have a protrusion that is elongated over a package of the electronic device. If the protrusion has a positioning part for positioning the electronic device by contacting a package of the electronic device, mounting of the electronic device on the circuit board will be easy and secure. For example, the electronic device can be positioned without using a fine positioning apparatus and it can be mounted on the board manually besides automatically. It becomes also easy to prevent the mis-mounting of the electronic device if the positioning part is formed in accordance with the package shape of the electronic device that is correctly mounted.

If the protrusion has a checking part for checking the connection of the electronic device and the material pattern, a highly reliable inspection can be done with ease. For example, if the checking part is electrically connected to the metal pattern, the short/open check can be done easily by applying a test apparatus such as a circuit tester to the checking part. As the inspection is not eye observation of the gap, it does not cause dispersive result depending on the inspector. As explained later, according to the arrangement of the electronic device's bumps or the shape of the metal pattern, the mis-mounting of the electronic device can be found easily.

If the protrusion has a heating part for contacting a heating means to melt solders of all the bumps which connect the metal pattern, the electronic device can be removed from the circuit board without heat stress or destruction. Besides, the removed electronic device can be reused. As there is no residue on the circuit board after removing the electronic device, removing process of the residue from the circuit board is not necessary when reusing the circuit board.

An electronic device mounting method on previously explained circuit board of still another aspect according to the present invention includes the steps of positioning the electronic device on the circuit board by contacting a package of the electronic device with a positioning part provided on the protrusion, heating a heating part provided on the protrusion, and checking the connection of the electronic device and the material pattern by using a checking part provided on the protrusion.

Because the metal pattern is formed on the surface of the circuit board so as to connect a plurality of the bumps electrically, the electronic device can connect with the circuit board easily and securely in comparison to the case where the bumps of small areas are connected with the pads of small areas with one another. The width of the metal pattern of the circuit board can be narrower than the width of the pads of the conventional circuit pattern. Therefore, the application area of the adhesive can be larger in mounting the electronic device on the circuit board. Then, it can use the provisional adhesion that has been conventionally difficult to apply to the electronic device having arrayed bumps, and it becomes easy to mount the electronic devices both on the front and on the back surfaces. Mounting of the electronic device on the circuit board will be easy and secure. For example, the electronic device can be positioned without using a fine positioning apparatus and it can be mounted on the board manually besides automatically. By heating the heating part provided on the protrusion, the electronic device can be connected with the circuit board without putting them into the reflow furnace. Therefore, the heat stress to the device will be small, and the connection process will be safer. For example, if the checking part is electrically connected to the metal pattern, the short/open check can be done easily by applying a test apparatus such as a circuit tester to the checking part. As the inspection is not eye observation of the gap, it does not cause dispersive result depending on the inspector. As explained later, according to the arrangement of the electronic device's bumps or the shape of the metal pattern, the mis-mounting of the electronic device can be found easily.

An electronic apparatus of still another aspect according to the present invention includes the previously explained circuit board on which an electronic device is mounted. This electronic apparatus includes, for example, a processing unit such as a personal computer or a server, a communication unit such as a mobile phone or a transceiver, an office equipment such as a printer or a copy machine, an audio visual equipment such as a television or an audio component, a home appliance such as an air conditioner or a refrigerator.

Other objects and further features of the present invention will become readily apparent from the following description of the preferred embodiments with reference to accompanying drawings.

BRIEF DESCRIPTION OF THE DRAWINGS

FIG. 1 is an explanatory view showing a mounting structure of an electronic device on a circuit board of one embodiment according to the present invention. FIG. 1A is a bottom view of the electronic device seen from its backside. FIG. 1B is a top view from front surface of the circuit board. FIG. 1C is a top view showing the state that the electronic device is mounted on the circuit board.

FIG. 2 also shows a function of positioning a protrusion and a function of preventing mis-mounting.

FIG. 5 is a sectional side view showing a mounting structure of an electronic device on a conventional circuit board.

FIG. 6 is an explanatory view showing the state of removing an electronic device from a conventional circuit board.

DETAILED DESCRIPTION OF THE PREFERRED EMBODIMENTS

Figure 2:
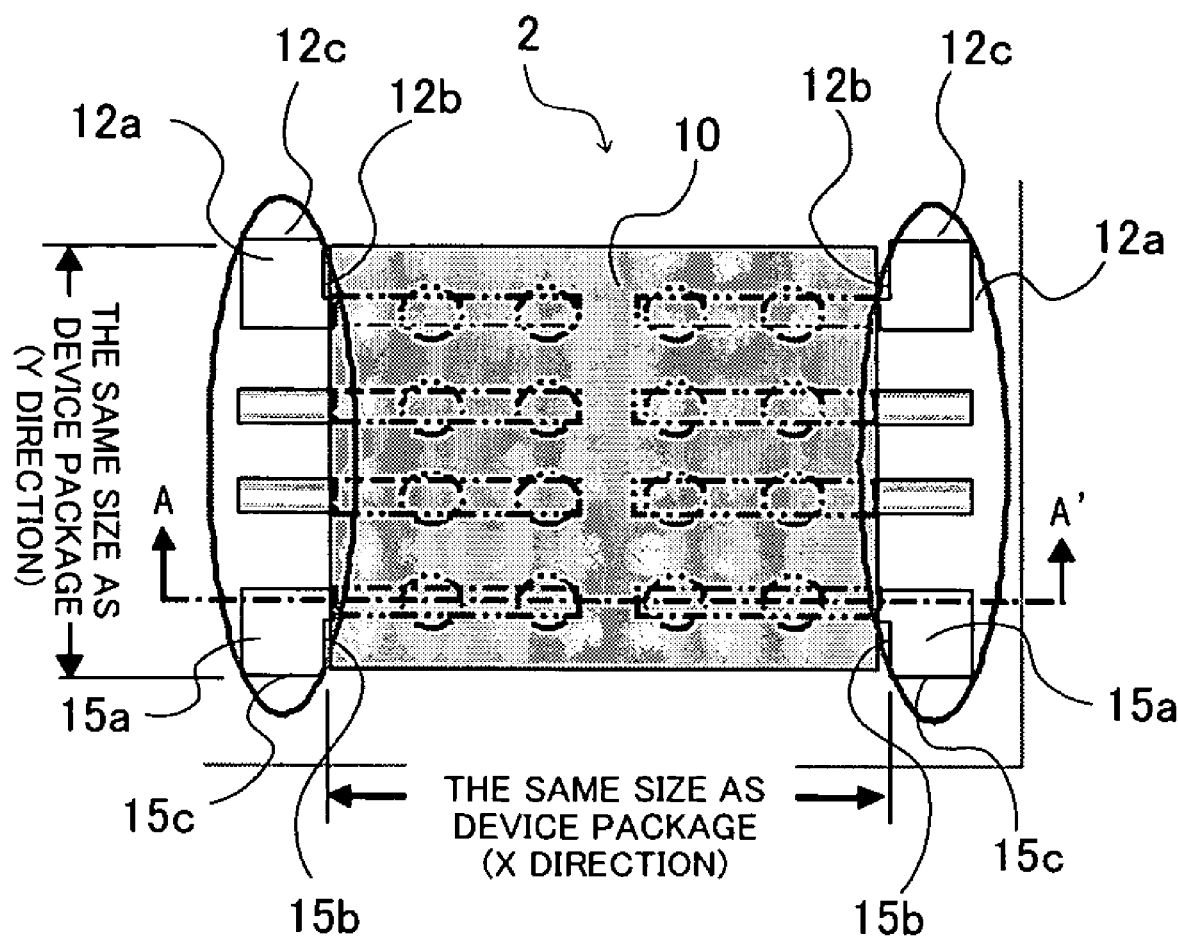
FIG. 2 is a top view showing the state that the electronic device is mounted on the circuit board of one embodiment according to the present invention.

Referring now to the accompanied drawings, a description will be now given of a circuit board of the first embodiment according to the present invention and a device mounting structure thereon. FIG. 1A is a bottom view of the electronic device 2 such as a condenser or semiconductor device seen from its backside, i.e., a terminal face. The electronic device 2 has a plurality of bumps 4 and the bumps 4 are arranged squarely as 4×4. That is, the interval between the bumps 4 in lateral direction (the Y direction) is the same as the interval between them in longitudinal direction (the X direction). A package 10 of the electronic device 2 is approximately a rectangular solid. The size along the X direction is a little longer than that along the Y direction shown in FIG. 1. The bumps 4 of the electronic device 2 are arrayed as V-line and G-line alternately along the Y direction, and four bumps 4 arrayed along the X direction have the same electric potentials.

FIG. 1B is a top view of the circuit board 6 which the electronic device 2 is mounted thereon. FIG. 1B shows only the mounting portion of the electronic device 2. However, the circuit board 6 has a lot of other electronic devices and is used as a printed circuit board such as a motherboard. A substrate 6a of the circuit board 6 uses, for example, thermoset resin such as glass epoxy resin or phenolic resin.

A front surface of the circuit board 6, i.e., a side that the electronic device 2 is mounted thereon has four metal patterns 12 to 15. The metal patterns 12 and 14 are to be connected with the bumps 4 of G-lines and the metal patterns 13 and 15 are to be connected with the bumps 4 of V-lines. The metal patterns 13 and 14 are approximately straight and have protrusions 13a and 14a which are elongated over the package 10 in their longitudinal directions.

The metal patterns 12 and 15 are also approximately straight and have protrusions 12a and 15a which are elongated over the package 10 in their longitudinal directions. The protrusions 12a and 15a are wider than the connection part with the bumps 4, i.e., the straight part of the metal patterns 12 and 15 shown in FIG. 1B Therefore, the metal patterns 12 and 15 have hooked shapes. And the protrusions 12a and 15a protrude from the surface of the circuit board 6 in a direction perpendicular to the drawing sheet of FIG. 1B (see also FIG. 3). Thus, side surfaces 12b and 15b function as positioning parts for positioning the electronic device 2 in the X direction by contacting the package 10 in mounting the electronic device 2 on the circuit board 6 (see also FIG. 1C and FIG. 2). As shown in FIG. 2, the positions of the other surfaces 12c and 15c of the protrusions 12a and 15a will become approximately even to the position of the side surface of the package 10 when the electronic device 2 is positioned correctly. Therefore, the electronic device 2 can be positioned appropriately in the Y direction by comparing the side surfaces 12c and 15c and the side surface of the package 10.

The width (the size along lateral direction) of the straight part of the metal patterns 12 to 15 are smaller than the diameters of the bumps 4. So, the interval between two metal patterns is relatively large, and the provisional adhesion by using adhesive explained later becomes easy.

The metal patterns 12 to 15 are formed straightly so as to electrically connect the four bumps 4 that has the same electrical potentials. For example, the metal pattern 12 electrically connects the four bumps 4 in G-line. Even if one of the four bumps 4 is not connected with the metal pattern 12 sufficiently, it causes no problem because the rest of three bumps 4 are securely connected with the metal pattern 12. If the position of the electronic device 2 shifts a little in the X direction, it also causes no problem because the metal pattern 12 is elongated straightly in the X direction. Other three metal patterns 13 to 15 also have these effects. However, the metal patterns 12 to 15 is divided approximately at the center of the straight portion into the upper portion and the lower portion, and they are not electrically connected with each other. The upper portion and the lower portion of metal patterns 12 to 15 are respectively connected with two bumps 4.

FIG. 2 is a top view showing the state that the electronic device 2 is mounted on the surface of the circuit board 6. In FIG. 2, the vertical direction indicates the Y direction and the horizontal direction indicates the X direction. The package 10 of the electronic device 2 is a rectangular shape when seen from the top and the size along the X direction is a little longer than that along the Y direction. Therefore, the side surfaces 12b and 15b do not contact the package 10 if the electronic device 2 is mis-mounted on the circuit board 6 rotationally at 90° in the X and Y directions. There may be a large gap between the side surfaces 12b and 15b and the package 10. Thus, the protrusions 12a and 15a have a function of preventing the mis-mounting, and the mis-mounting of the electronic device 2 can be found at the time of mounting the electronic device 2.

The description has been given in the case where the size of the package 10 along the X direction is longer than that along the Y direction in this embodiment. However, if the size of the package 10 along the X direction is shorter than that along the Y direction and the side surfaces 12b and 15b are provided in accordance with the shorter size along the X direction, the electronic device 2 mounted in the wrong direction interferes the protrusions 12a and 15b. This prevents the mis-mounting more effectively because the electronic device 2 cannot be mounted on the circuit board 6 in the wrong direction.

Figure 3:
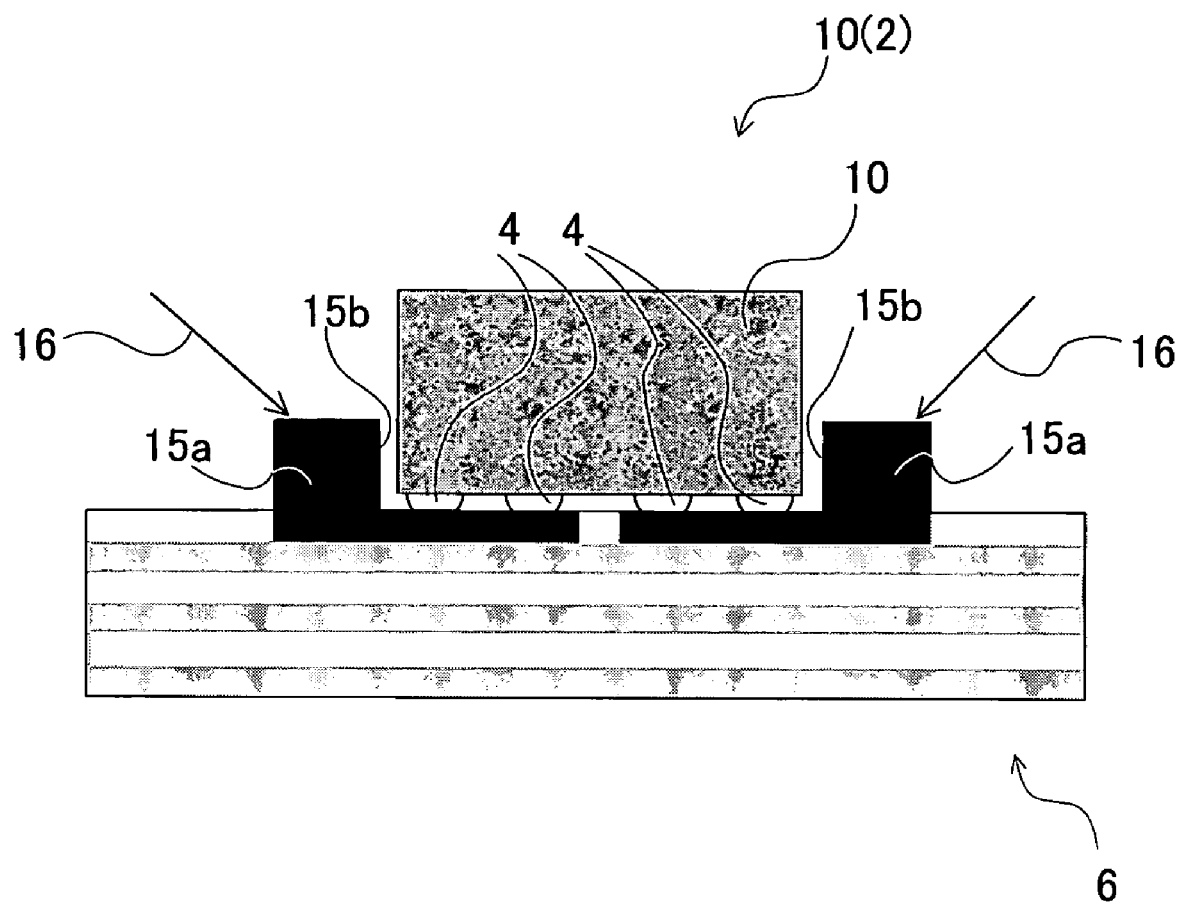
FIG. 3 is an explanatory view showing the state of doing a short/open check after mounting of the electronic device on the circuit board shown in FIG. 1, and is also a sectional view of A-A' section shown in FIG. 2.

FIG. 3 is a view showing the state of doing an inspection, concretely a short/open check of the electronic device 2 after being mounted. FIG. 3 also shows A-A' section shown in FIG. 2. The short/open check that the inspector conventionally does by eye observation can be achieved more easily and securely by using a test apparatus such as a tester according to this embodiment.

Two probes 16, 16 of the tester are contacted to the two protrusions 15a, 15a located both ends of the metal pattern 15. The two probes 16, 16 of the tester are electrically conducted when the electronic device 2 is correctly mounted and the bumps 4 are appropriately connected with the metal pattern 15 despite that the upper portion and the lower portion of the metal pattern 15 are separated. Thus, the connections can be confirmed to be appropriate in the V-line by checking the conductions. By checking the conductions of the probes 16, 16 of the tester that are contacted to the protrusions 12a to 14a at the both ends of the other metal pattern 12 to 14, the short/open check of the electronic device 2 can be done easily and securely. Thus, the protrusions 12a to 15a function as checking parts.

Figure 4:
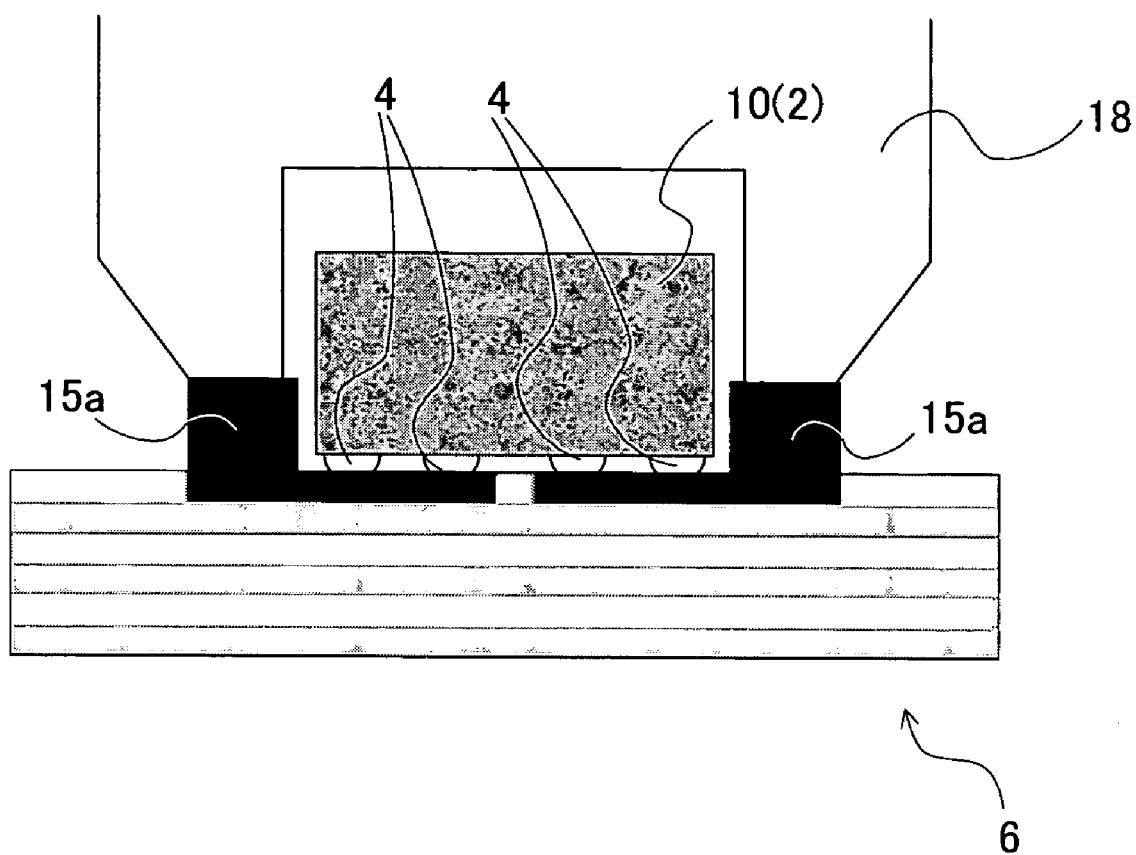
FIG. 4 is a sectional side view showing the state of removing the electronic device from the circuit board shown in FIG. 1.
Figure 5A:
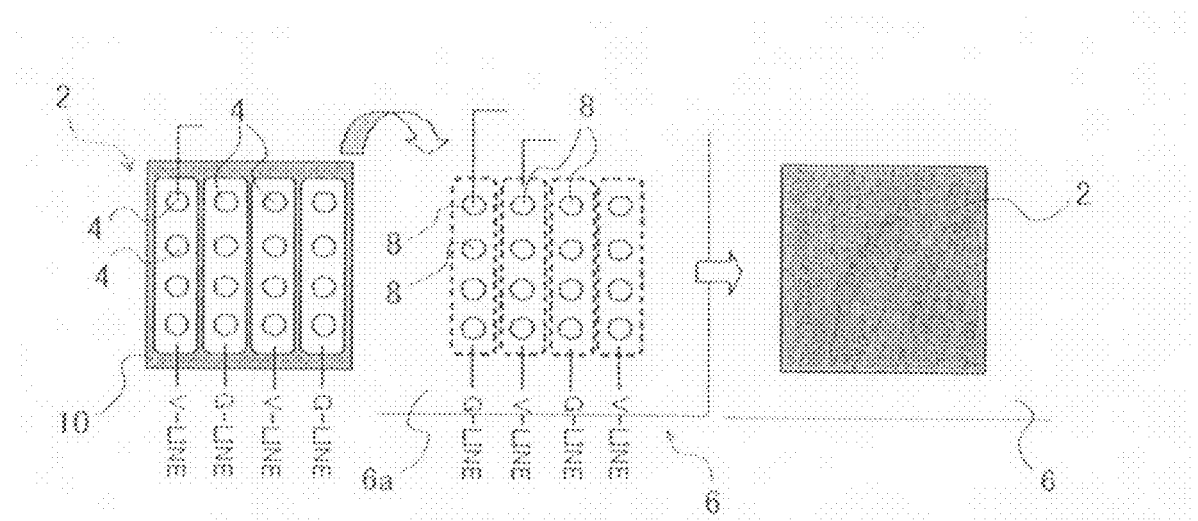
FIG. 5A shows a bottom of the electronic device and a top of the circuit board before and after mounting.
Figure 5B:
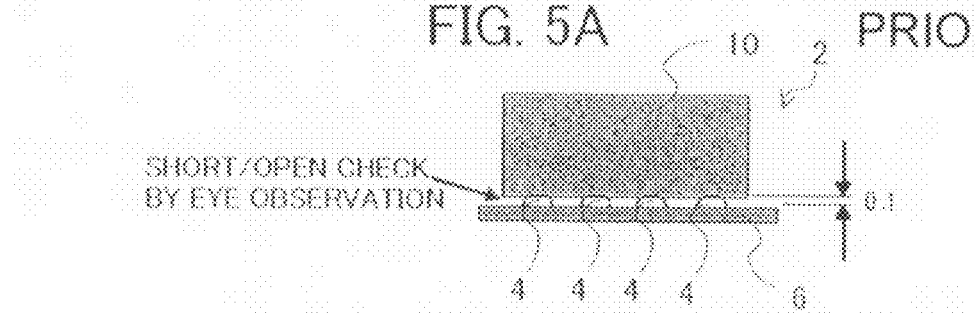
FIG. 5B is a side view showing the state of doing a short/open check after mounting.
Figure 5C:
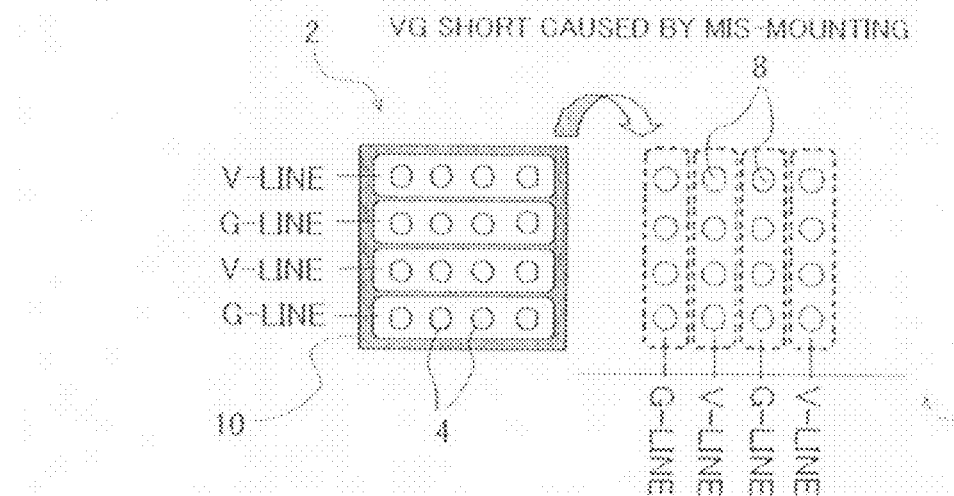
FIG. 5C is an explanatory view showing happening of mis-mounting.
Figure 6A:
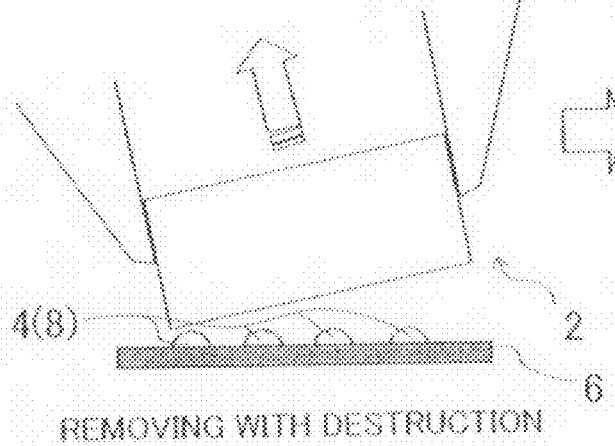
FIG. 6A is a side view for explaining the removing with destruction method.
Figure 6B:
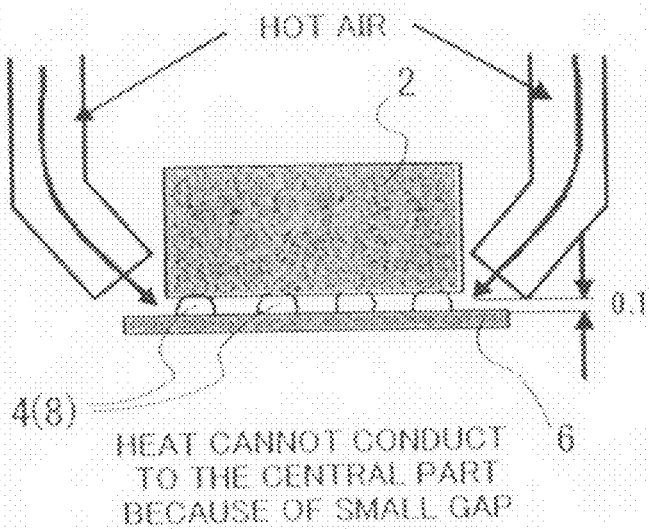
FIG. 6B is a side view for explaining the hot air method.

FIG. 4 is a sectional side view showing the state of removing the electronic device 2 mounted on the circuit board 6 from the circuit board 6. A soldering iron 18 as a heating means that has hooked shape ("C" shape) contacts two protrusions 15a at the both ends that function as heating parts. It is not shown but the soldering iron 18 also contacts protrusions 12a to 14a at the same time. As the protrusions 12a to 15a are located outside around the package 10, the soldering iron 18 can contact them easily.

The soldering iron 18 conducts the heat to the protrusions 12a to 15a and then to the bumps 4 that are connected to the metal pattern 12 to 15. As it is metal conduction of heat, conduction loss is little and solder of the bumps 4 melt easily. Therefore, the electronic device 2 can be removed from the circuit board 6 easily without the heat stress to the electronic device 2 and the circuit board 6 or the destruction of them. Removed electronic device 2 can be reused because of no destruction. As there is no residue on the circuit board 6 after removing the electronic device 2, the removing process of the residue from the circuit board 6 is not necessary in reusing the circuit board 6.

Still, the metal patterns 12 to 15 of the circuit board 6 according to this embodiment have widths of the straight parts narrower than the diameters of the bumps 4. Moreover, the metal patterns 12 to 15 are divided at approximately their centers. So, the areas occupied by the metal patterns 12 to 15 are relatively small in the area of the circuit board 6 overlapped by the package 10. The area of the substrate 6a, i.e., the areas which are not occupied by the metal patterns 12 to 15 is relatively large, and can be applied the adhesive thereon. The substrate 6a part is appropriate to be applied the adhesive because of its linearity. This is the reason why the electronic device 2 is easy to be adhered provisionally to the circuit board 6. Thus, the electronic device 2 can be mounted either on the front surface or on the back surface of the circuit board 6 with using the provisional adhesion. That is, if an electronic device is adhered provisionally in advance to the back surface of the circuit board 6, it does not come off and fall down from the back surface while the electronic device 2 is being mounted on the front surface of the circuit board 6.

According to the present invention as previously explained, the electronic device can be connected with the circuit board easily and securely. The mis-mounting of the electronic device onto the circuit board can be prevented, and can be found in the later process easily even if the mis-mounting happens to be. The electronic device can be mounted on the circuit board either automatically or manually because it is easy to position the electronic device. More, the inspection such as connection check can be done easily and securely after mounting. As the electronic device can be removed from the circuit board without the heat stress or destruction, they can be reused.

Further, the present invention is not limited to this preferred embodiment, and various variations and modifications may be made without departing from the scope of the present invention. For example, the present invention can be applied to a carriable transceivers besides to a mobile phones.

What is claimed is:

1. A circuit board having a mounting area to be mounted with an electronic component that has plural solder bumps that are two-dimensionally arranged, said circuit board comprising:

plural metal strip-shaped patterns, each of which extends in parallel in a first direction, exposes on a surface of said circuit board, and crosses from an inside to an outside of the mounting area, part of each metal pattern located in the mounting area being electrically connectable to plural corresponding solder bumps, wherein at least one outermost patterns among the plural metal patterns has a part that is located outside the mounting area, and bends in a second direction orthogonal to the first direction to form two side surfaces used for an alignment between the electronic component and the mounting area in the first and second directions in mounting the electronic component on the mounting area of the circuit board.

2. The circuit board according to claim 1, wherein the at least one of the pair of outermost patterns has a U shape.

3. The circuit board according to claim 1, wherein the plural metal patterns are formed on both front and back surfaces of said circuit board.

4. The circuit board according to claim 1, wherein each metal pattern has a part that is located outside the mounting area, and serves as a heating terminal used to melt the plural corresponding solder bumps on the mounting area through heat conduction, and as an inspection terminal used to inspect an electric connection condition between the plural corresponding solder bumps and the metal pattern.

5. An electronic apparatus comprising:
a circuit board according to claim 1; and
an electronic component mounted on the circuit board.

* * * * *